(12) United States Patent
Johnson et al.

(10) Patent No.: US 10,660,233 B2
(45) Date of Patent: *May 19, 2020

(54) PROTECTIVE APPARATUS USABLE WITH A FORCED AIR COOLING SYSTEM AND ELECTRICAL ENCLOSURE

(71) Applicant: EATON CORPORATION, Cleveland, OH (US)

(72) Inventors: Wesley Byron Johnson, Fletcher, NC (US); Jon Christopher Beaver, Asheville, NC (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 430 days.

This patent is subject to a terminal disclaimer.

(21) Appl. No.: 15/484,713

(22) Filed: Apr. 11, 2017

(65) Prior Publication Data

US 2017/0265327 A1    Sep. 14, 2017

Related U.S. Application Data

(63) Continuation of application No. 14/858,191, filed on Sep. 18, 2015, now Pat. No. 9,620,937.

(51) Int. Cl.
*H02B 1/56* (2006.01)
*H05K 7/20* (2006.01)
*H02B 13/025* (2006.01)

(52) U.S. Cl.
CPC ......... *H05K 7/20145* (2013.01); *H02B 1/565* (2013.01); *H02B 13/025* (2013.01)

(58) Field of Classification Search
CPC .......... H05K 7/20145; H05K 7/20136; H05K 7/20154; H05K 7/20163; H05K 7/20172; H05K 7/20181; H05K 7/20009; H02B 13/025; H02B 1/565; H02B 1/56
See application file for complete search history.

(56) References Cited

U.S. PATENT DOCUMENTS

| | | | | |
|---|---|---|---|---|
| 5,118,173 | A | * | 6/1992 | Proctor ................. D06F 95/002 220/23.88 |
| 5,500,028 | A | * | 3/1996 | Iizuka ................ B01D 46/0013 312/223.1 |
| 6,149,254 | A | * | 11/2000 | Bretschneider ........ H02B 1/565 312/213 |

(Continued)

*Primary Examiner* — Anthony M Haughton
(74) *Attorney, Agent, or Firm* — Eckert Seamans Cherin & Mellott, LLC

(57) ABSTRACT

An electrical enclosure apparatus includes a protective apparatus that permits forced-air cooling of the interior of the enclosure while resisting structures that are within in the interior from being blown out of the electrical enclosure as a result of an arc event or other event. The protective apparatus includes a flow apparatus formed from one or more blocks of ceramic material having foamed therein a plurality of elongated flow channels. The flow apparatus is supported inside a duct with the use of a support apparatus. The ceramic material from which the flow apparatus is formed is configured to withstand the heat that may be experienced in an arc event and is additionally configured to be sufficiently rigid and tough to retain within the duct any structures within the enclosure from being blown out of the protective apparatus, thereby protecting personnel who may be in the area.

20 Claims, 6 Drawing Sheets

(56) References Cited

U.S. PATENT DOCUMENTS

| | | | | |
|---|---|---|---|---|
| 6,877,551 B2* | 4/2005 | Stoller | H02B 1/565 | 165/122 |
| 6,889,752 B2* | 5/2005 | Stoller | H05K 7/206 | 165/122 |
| 7,729,115 B2* | 6/2010 | Hall | H05K 7/20918 | 165/183 |
| 8,072,752 B2* | 12/2011 | Wantschik | H02B 1/565 | 312/223.1 |
| 8,590,602 B2* | 11/2013 | Fernandez | H05K 7/206 | 165/104.33 |
| 9,795,067 B2* | 10/2017 | Takezawa | H02M 7/48 | |
| 10,111,360 B2* | 10/2018 | Perrin | H05K 7/2089 | |
| 2003/0168433 A1* | 9/2003 | Kurzmann | H01H 9/342 | 218/157 |
| 2005/0193930 A1* | 9/2005 | Hartel | A47B 83/001 | 108/106 |
| 2009/0296321 A1* | 12/2009 | Wantschik | H02B 1/565 | 361/677 |
| 2012/0218067 A1* | 8/2012 | Ballard | H02F 27/02 | 336/90 |
| 2013/0137358 A1* | 5/2013 | Manahan | F24F 13/20 | 454/184 |
| 2014/0097734 A1* | 4/2014 | Gingrich | H02B 1/38 | 312/326 |
| 2014/0118887 A1* | 5/2014 | Deb | H02B 13/025 | 361/622 |
| 2014/0160636 A1* | 6/2014 | Rajvanshi | H05K 7/20581 | 361/608 |
| 2015/0116911 A1* | 4/2015 | Sharma | H02B 1/565 | 361/605 |
| 2015/0372463 A1* | 12/2015 | Prakash | H02B 13/025 | 361/611 |
| 2016/0042896 A1* | 2/2016 | Kingston | H01H 33/53 | 218/157 |
| 2016/0156163 A1* | 6/2016 | Faber | H02B 13/025 | 361/605 |
| 2016/0233651 A1* | 8/2016 | Pare | H02B 1/28 | |
| 2016/0242315 A1* | 8/2016 | Pawar | H02B 1/56 | |

* cited by examiner though it is understood that the forced air cooling system 10 could be of any of a wide variety of configurations without departing from the present concept.

PROTECTIVE APPARATUS USABLE WITH A FORCED AIR COOLING SYSTEM AND ELECTRICAL ENCLOSURE

CROSS REFERENCE TO RELATED APPLICATION

The instant application is a continuation of and claims priority from U.S. patent application Ser. No. 14/858,191, filed Sep. 18, 2015, now U.S. Pat. No. 9,620,937, the disclosures of which are incorporated herein by reference.

BACKGROUND

Field

The disclosed and claimed concept relates generally to electrical power distribution equipment and, more particularly, to a protective apparatus that is usable with a forced air cooling system of an electrical enclosure.

Related Art

Many kinds of electrical power distribution equipment are known in the relevant art. Such electrical equipment includes switchgear cabinets and other enclosures that contain therein equipment such as circuit interrupters, switching devices, and the like. Such equipment is desirably situated within such enclosures because of the risk of electrical shock and other possible hazards.

Due to the potential for electrical arcing, some cabinets have been configured to be arc resistant, meaning that they are configured to resist dangerous materials exiting the cabinet in an arc event. Some enclosures, however, have the potential to generate significant heat therein during regular operation, and such enclosures have been configured to include passages that permit forced air to be circulated into and through the cabinets to provide cooling. Such forced-air arc-resistant electrical enclosures have been difficult to configure successfully since the passages that permit the forced air to flow into, through, and out of the interior of the electrical enclosure can also have a tendency to permit high pressure gases, plasma, and/or flames to flow out of the cabinet in the event of an arc. Improvements would thus be desirable.

SUMMARY

An improved electrical enclosure apparatus includes a protective apparatus that permits forced-air cooling of the interior of the enclosure while resisting structures that are within in the interior from being blown out of the electrical enclosure as a result of an arc event or other event. The protective apparatus includes a flow apparatus formed from one or more blocks of ceramic material having formed therein a plurality of elongated flow channels through which a stream of air flows when flowing from the interior region of the enclosure toward the atmosphere. The flow apparatus is supported inside a duct with the use of a support apparatus. The ceramic material from which the flow apparatus is formed is configured to withstand the heat that may be experienced in an arc event and is additionally configured to be sufficiently rigid and tough to retain within the duct any structures within the enclosure from being blown out of the protective apparatus, thereby protecting personnel who may be in the area.

Accordingly, an aspect of the disclosed and claimed concept is to provide an improved protective apparatus that is configured to resist the dangerous potential effects of an arc event within the interior of an electrical enclosure that is cooled by forced air.

Another aspect of the disclosed and claimed concept is to provide such a protective apparatus that employs one or more blocks of ceramic material that are formed with elongated channels through which the air of a forced air cooling system can flow when exiting an arc-resistant electrical enclosure but which resists other structures from within the electrical enclosure from reaching the exterior.

As such, an aspect of the disclosed and claimed concept is to provide an improved protective apparatus that is structured for use with a forced air cooling system of an electrical enclosure apparatus, with the protective device being structured to resist the discharge of articles therethrough in an arc event within an interior region of the electrical enclosure. The protective apparatus can be generally stated as including a duct having at least a first wall and further having an interior region situated adjacent the at least first wall, the duct being structured to be connected in fluid communication with the forced air cooling system, and being structured to carry a stream of air therethrough, a flow apparatus that can be generally stated as including at least a first block formed at least in part of a ceramic material and having a plurality of flow channels formed therein, the at least first block being structured to be situated in the stream of air and to have the stream of air flow through the plurality of flow channels, and a support apparatus that can be generally stated as including at least a first support that is structured to be mounted to the duct, the at least first blocking structure being situated adjacent the at least first support.

BRIEF DESCRIPTION OF THE DRAWINGS

A further understanding of the disclosed and claimed concept can be gained from the following Description when read in conjunction with the accompanying drawings in which:

Similar numerals refer to similar parts throughout the specification.

DESCRIPTION

Figure 1:
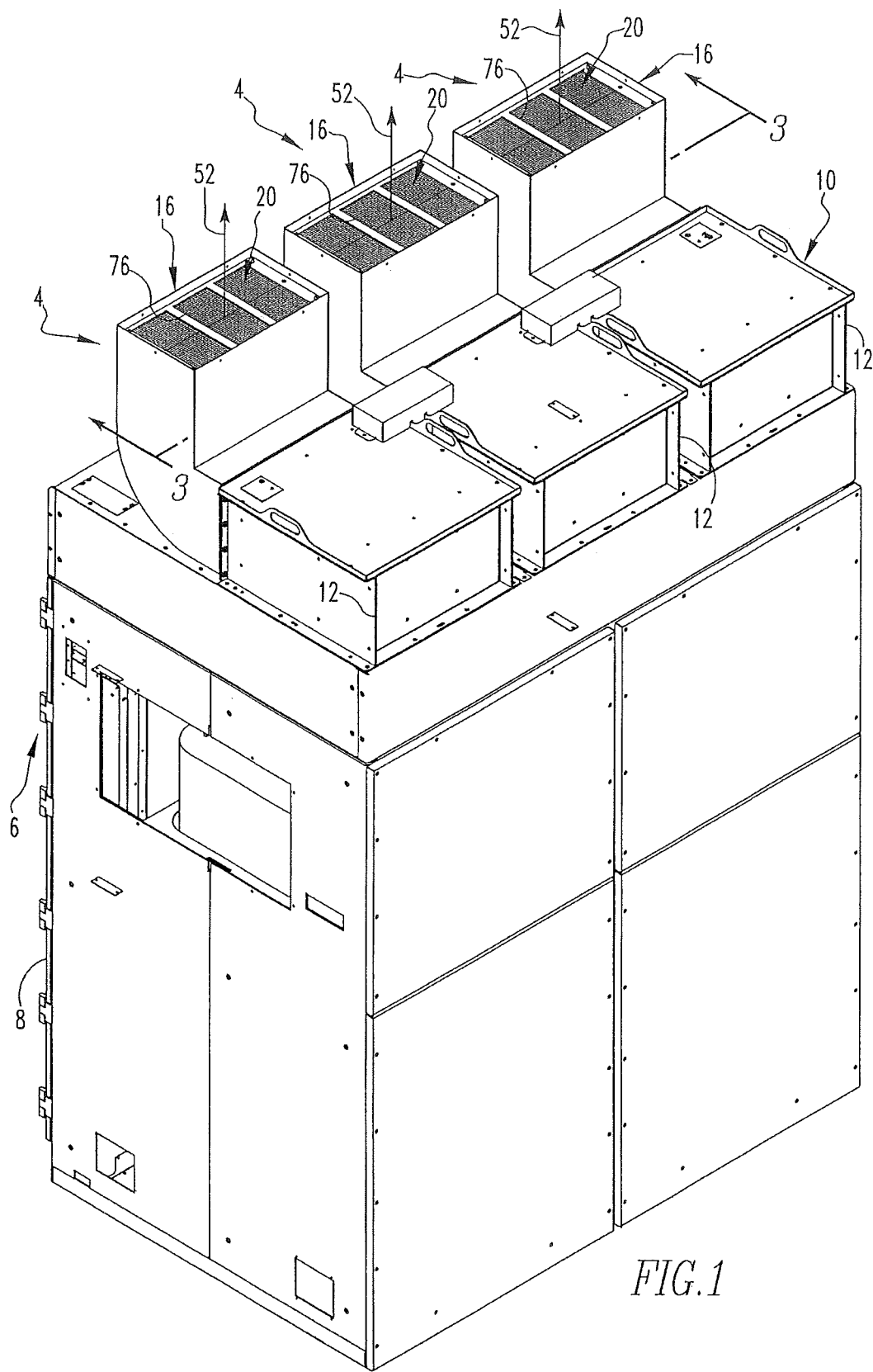
FIG. 1 is a perspective view of an improved electrical enclosure apparatus in accordance with the disclosed and claimed concept that includes an improved protective apparatus in accordance with the disclosed and claimed concept.

An improved protective apparatus 4 in accordance with an aspect of the disclosed and claimed concept is depicted in FIG. 1 as being a part of an improved electrical enclosure apparatus 6 that is in accordance with an aspect of the disclosed and claimed concept. The electrical enclosure apparatus 6 includes an arc-resistant electrical enclosure 8 and a forced air cooling system 10 that is depicted in FIG.

1 as being represented by a blower assembly 12. The electrical enclosure 8, as stated, is an arc-resistant electrical enclosure that resists an arc event within an interior region of the electrical enclosure 8 from injuring personnel who may be situated outside the electrical enclosure 8, i.e., within the atmosphere surrounding the electrical enclosure 8. The minimization of such potential for injury and other danger is advantageous.

Figure 2:
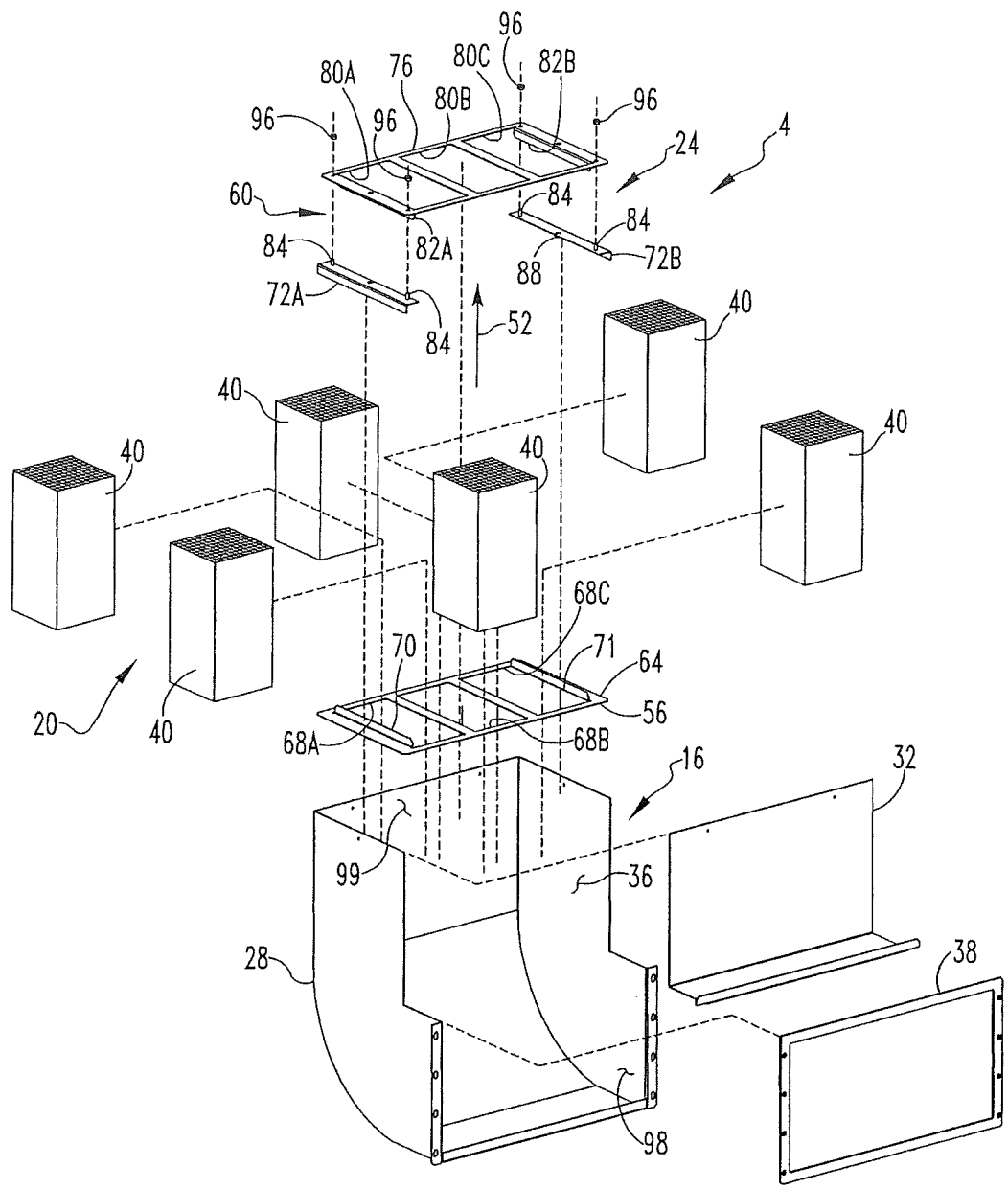
FIG. 2 is an exploded perspective view of the protective apparatus of FIG. 1.

As can be understood from FIGS. 1 and 2, the protective apparatus 4 can be said to include a duct 16, a flow apparatus 20, and a support apparatus 24. The duct 16 is connected in fluid communication with the blower assembly 12 and serves as the flow outlet for the cooling air that is drawn out of the interior region of the electrical enclosure 8 by the forced air cooling system 10.

The duct 16 is more clearly depicted in FIG. 2 as including a first duct portion 28 and a second duct portion 32 that are affixed together such as via welding or with the use of mechanical fasteners or the like to result in the duct 16 having a wall 18 and having an interior region 36 being situated adjacent the wall 18. A gasket 38 is engageable between the duct 16 and the blower assembly 12 to resist leakage of air therebetween.

Figure 6:
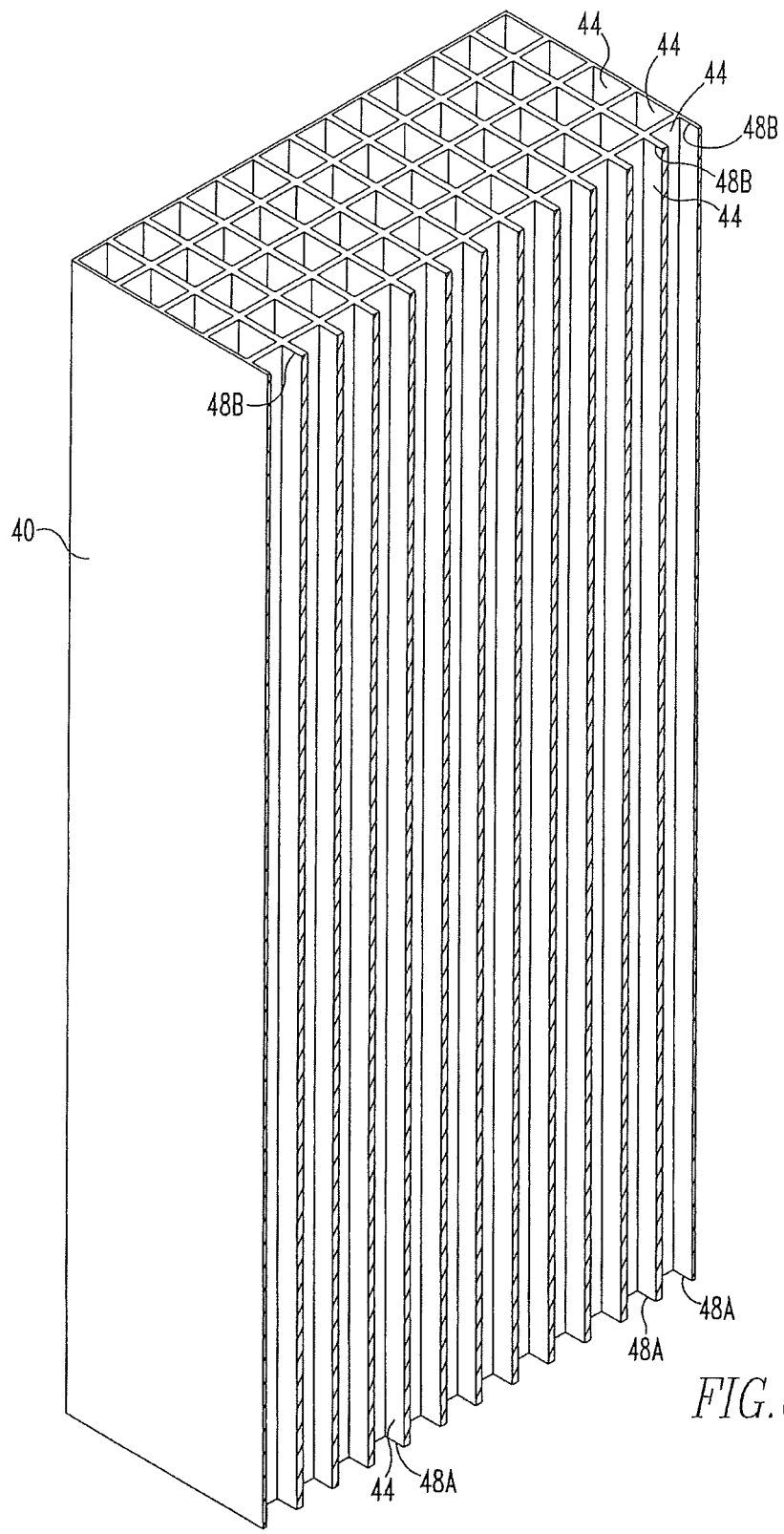
FIG. 6 is a perspective sectional view as taken along line 6-6 of FIG. 3.

The flow apparatus 20 is depicted in FIG. 2 as including a number of blocks 40 that are, in the depicted exemplary embodiment, of an approximately parallelepiped shape and are formed of a ceramic material. The blocks 40 each include a number of elongated flow channels 44 formed therein, as is depicted generally in FIG. 6. As employed herein, the expression "a number of" and variations thereof shall refer broadly to any non-zero quantity, including a quantity of one. The flow channels 44 each include a pair of openings 48A and 48B at the ends thereof. During operation of the forced air cooling system 10, the blower assembly 12 causes a stream of air 52 to flow into an inlet region 98 the duct 16 and to thereafter flow into the openings 48A of the flow channels 44. The stream of air 52 then flows through the flow channels 44 and out of the openings 48B into an outlet 99 of the duct 16 and then into the atmosphere.

The flow channels 44 in the depicted exemplary embodiment have a length many times greater than their cross-sectional dimensions. The exemplary flow channels 44 are depicted herein as being of an approximately rectangular cross-sectional shape, but it is understood that the flow channels 44 and their openings 48A and 48B can be of any shape that is appropriate to the particular application. The exemplary flow channels 44 may occupy approximately one-half or more of the cross-sectional area of the block 40, i.e., the dimensions that are transverse to the flow direction of the stream of air 52. The air inlet from the electrical enclosure 8 into the blower assembly 12 is much smaller than the overall cross-sectional dimensions of the duct 16, i.e., the dimensions of the duct 16 transverse to the flow direction of the stream of air 52. It is therefore understood that the flow apparatus 20 and the flow channels 44 formed therein are configured to permit the free flow of exhausted cooling air out of the blower assembly 12, through the protective apparatus 4, and into the atmosphere, without imposing on the stream of air 52 a meaningful flow resistance.

Since the blocks 40 are formed at least in part of a ceramic material, the blocks 40 are capable of withstanding the extreme heat that might be experienced upon the occurrence of an arc event within the interior of the electrical enclosure 8. Moreover, by providing the flow channels 44 formed within the blocks 40, the exhausted cooling air can flow through the channels 44, but the ceramic material of the blocks 40 will block the passage of any structures from the interior of the electrical enclosure 8 that may become airborne within the interior of the electrical enclosure 8 due to an arc event.

The flow apparatus 20 is supported within the interior region 36 of the duct 16 by the support apparatus 24. The support apparatus 24 includes a first support 56 and a second support 60 that retain the blocks 40 within the interior region 36 in a position oriented such that the flow channels 44 can carry the stream of air 52 therethrough to the outlet 99 of the duct 16.

The first support 56 includes a plate-like first member 64 that has a plurality of first openings 68A, 68B, and 68C formed therein. The first support 56 is affixed to the duct 16, such as by welding the first member 64 to the first duct portion 28, although any of a variety of attachment methodologies can be employed without departing from the present concept. The first member 64 further includes a pair of tabs 70 and 71 that are in the form of upturned portions of the plate-like first member 64 situated adjacent the first openings 68A and 68C, respectively. It can be understood from FIG. 3 that the tabs 70 and 71 retain the blocks 40 therebetween when the blocks 40 are resting on the first member 64. The tabs 70 and 71 retain the blocks 40 closely adjacent one another to retain the flow channels 44 and, more specifically, the openings 48A, in fluid communication with the first openings 68A, 68B, and 68C. As employed herein, the expression "upturned" is not intended to be limited to a specific upward or otherwise orientation with respect to the vertical or to refer to an upward direction, but rather is intended to refer to the material of the first member 64 being bent at an angle with respect to the other portions of the first member 64 such that the tabs 70 and 71 are formed from the original plate-like structure that forms the first member 64 but which diverge from the original plate-like orientation of the remaining portions of the first member 64.

Figure 3:
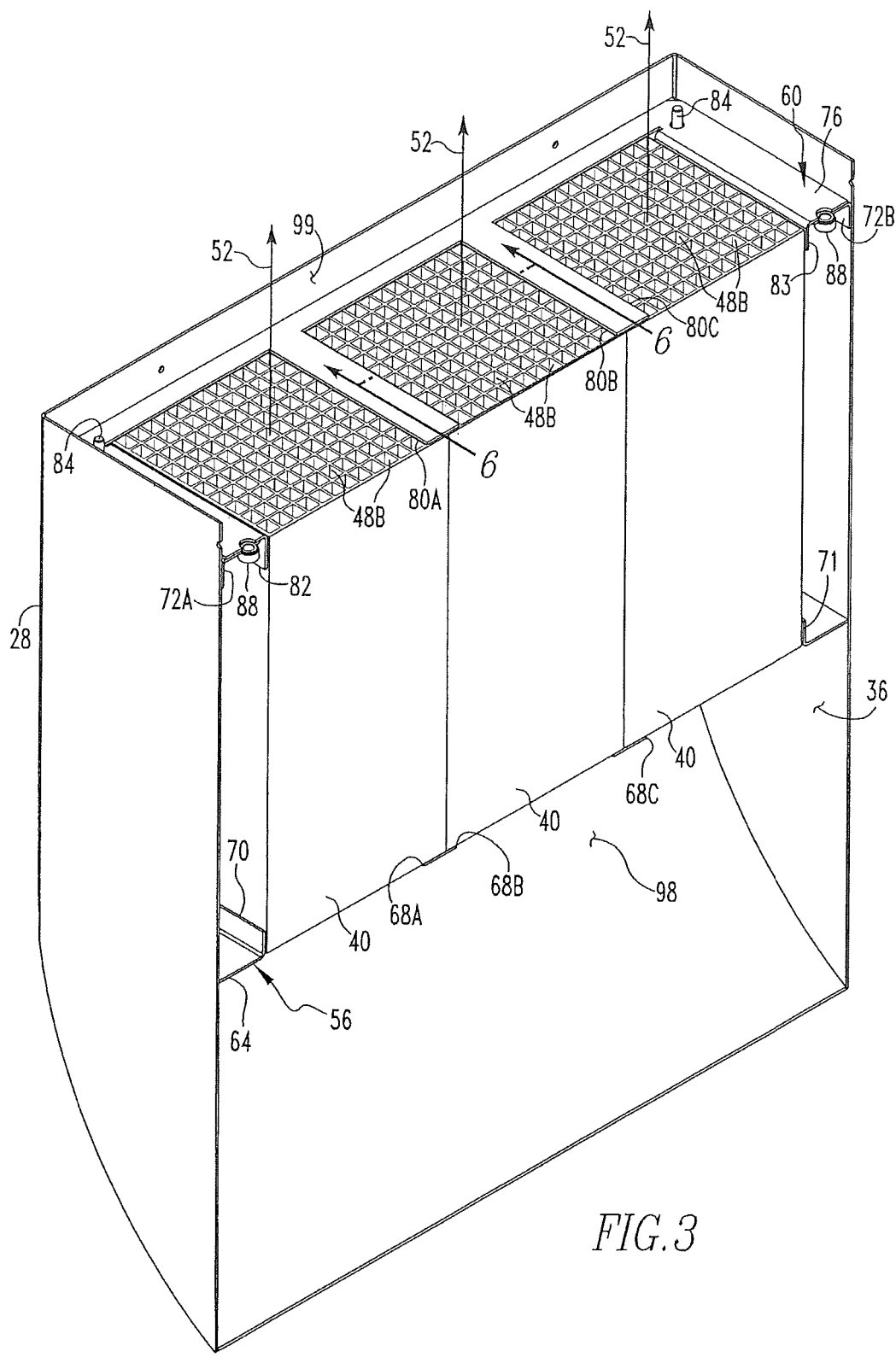
FIG. 3 is a sectional view as taken along line 3-3 of FIG. 1.
Figure 4:
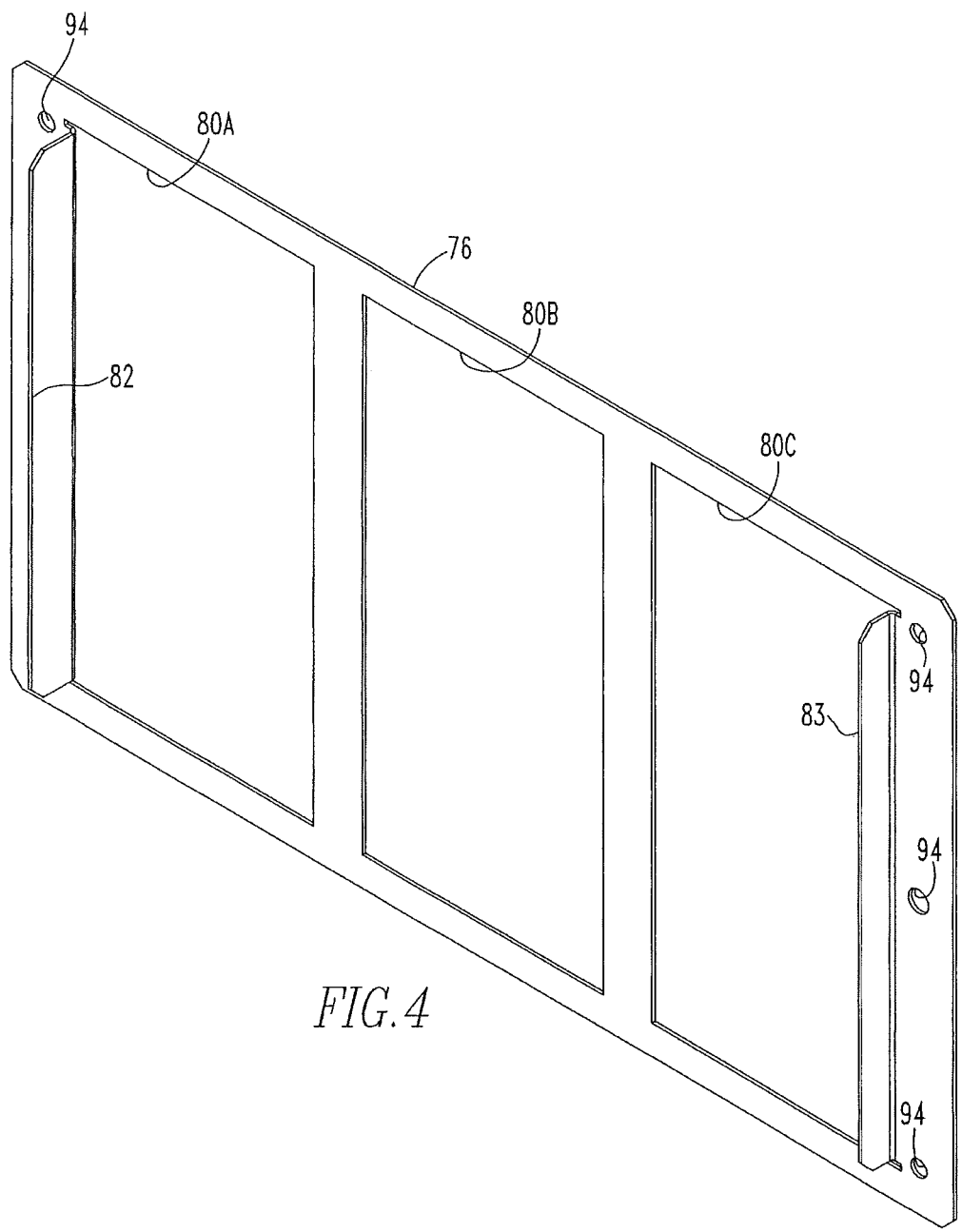
FIG. 4 is a perspective view of a portion of a support apparatus of the protective apparatus of FIG. 1.

The second support 60 includes a pair of brackets 72A and 72B and a plate-like second member 76. The second member 76 is a retainer that retains the blocks in the assembled position, such as is depicted in FIGS. 1 and 3. The brackets 72A and 72B are formed with a plurality of holes there configured to have press fit therein a set of studs 84 that are externally threaded and a set of receptacles 88 that are internally threaded. The receptacles 88 are provided to work in cooperation with other structures. The brackets 72A and 72B are affixed to the duct 16 within the interior region 36 such as by welding the brackets 72A and 72B to the duct 16 or via other appropriate attachment methodologies.

The second member 76 includes a plurality of second openings 80A, 80B, and 80C formed therein. The second member 76 additionally includes a pair of tabs 82 and 83 that are upturned from the material of the second member 76 and are situated adjacent the second openings 80A and 80C, respectively. The tabs 82 and 83 are configured to be situated adjacent the blocks 40 and to retain the blocks 40 in a position physically close to one another and retain the openings 48B in fluid communication with the second openings 80A, 80B, and 80C formed in the second member 76. In this regard, the second openings 80A, 80B, and 80C are configured to be situated adjacent the openings 48B atop the blocks 40. The second member 76 furthermore has a set of holes 94 formed therein that are aligned with the studs 84 and the receptacles 88 that are press fit into the brackets 72A and 72B when the brackets 72A and 72B are overlaid by the second member 76.

Figure 5:
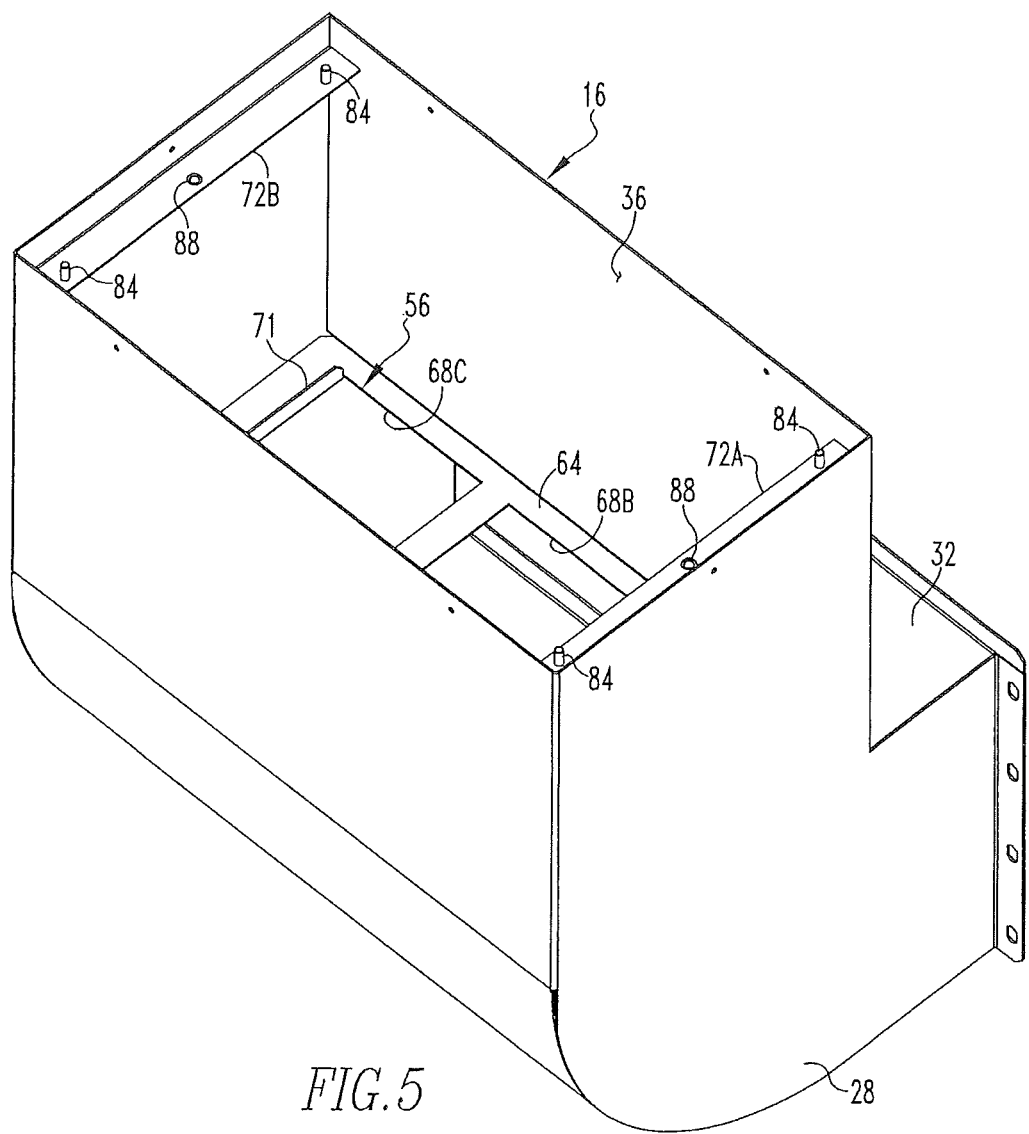
FIG. 5 is a perspective view into an interior region of a duct of the protective apparatus of FIG. 1.

To assemble the protective apparatus 4, the first member 64 and the brackets 72A and 72B are affixed to the duct 16 within the interior region 36, as is indicated generally in FIG. 5. The blocks 40 are then received within the interior region 36 atop the first member 64 and situated between the tabs 70 and 71. In such a position, the blocks 40 will be situated directly above the first openings 68A, 68B, and 68C, thereby permitting the flow channels 44 to be placed in fluid communication with the stream of air 52 that will flow once the blower assembly 12 is energized.

The second member 76 is then received atop the blocks 40 such that the studs 84 are received in the holes 94 that are formed in the second member 76. In so doing, the upper edges of the blocks 40 are received between the tabs 82 and 83, thereby retaining the upper ends of the blocks 40 in close proximity to one another and retaining the openings 48B in fluid communication with the second openings 80A, 80B, and 80C. A set of nuts 96 are then received on the studs 84 and are tightened sufficiently to retain the first member 76 in place without cracking the blocks 40.

In operation, the blower assembly 12 is energized to cause the stream of air 52 to be drawn out of the interior region of the electrical enclosure 8 and to be blown into the inlet region 98 of the duct 16. From there, the stream of air 52 flows into the first openings 68A, 68B, and 68C, and into the openings 48A of the blocks 40. The stream of air 52 then flows through the flow channels 44, out of the openings 48B, thought the second openings 80A, 80B, and 80C, and then out of the outlet 99 of the duct 16 and into the atmosphere.

The stream of air 52 thus freely flows through the protective apparatus 4 during normal operation of the electrical enclosure apparatus 6. In an arc event or other event, however, the flow channels 44 may accommodate a small portion of the high pressure gas flow that may result from the arc but resist much of the high pressure gas flow due to the fluid dynamics of the flow channels 44. Moreover, the structural portions of the blocks 40, i.e., those portions of the blocks 40 that are situated adjacent and that define the flow channels 44, will block the passage of any structural elements or other items that may become dislodged from the interior of the electrical enclosure 8 and blown toward the inlet 98 during an arc event. The resistance to such structures exiting the electrical enclosure apparatus 6 advantageously resists injury to nearby personnel.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. A protective apparatus structured for use within a duct of a forced air cooling system of an electrical enclosure assembly, the forced air cooling system configured to draw air out of an interior region of the electrical enclosure assembly and exhaust the air through the duct, the protective apparatus comprising:
   a flow apparatus configured to be mounted within the duct and having a plurality of flow channels formed therein to permit air to flow therethrough; and
   a support that is structured to mount the flow apparatus within the duct of the forced air cooling system.

2. The protective apparatus of claim 1 wherein the flow apparatus is structured to block the passage of articles therethrough in the event of an arc event within the interior region of the electrical enclosure assembly.

3. The protective apparatus of claim 1 wherein the at least first support comprises a plate-like member that has formed therein at least a first opening through which the stream of air is structured to flow, the plurality of flow channels being situated in fluid communication with the at least first opening.

4. The protective apparatus of claim 3 wherein the at least first support further comprises a number of alignment structures that are engageable with the at least first body to retain the at least first body in a position overlying the at least first opening with the plurality of flow channels being situated in fluid communication with the at least first opening.

5. The protective apparatus of claim 4 wherein the plate-like member includes an upturned tab adjacent the at least first opening, the tab being an alignment structure of the number of alignment structures.

6. The protective apparatus of claim 5 wherein the support apparatus further comprises at least a first bracket structured to be affixed to the forced air cooling system and a retainer affixed to the at least first bracket, the at least first body being situated between the at least first support and the retainer.

7. The protective apparatus of claim 6 wherein the retainer comprises another plate-like member that has formed therein another opening through which the stream of air is structured to flow, the another plate-like member including another upturned tab that is situated adjacent the another opening and that is engageable with the at least first body to retain the at least first body in a position wherein the another opening and the at least first body overlie one another with the plurality of flow channels being situated in fluid communication with the another opening.

8. The protective apparatus of claim 1 wherein the support apparatus further comprises at least a first bracket structured to be affixed to the forced air cooling system and a retainer affixed to the at least first bracket, the at least first body being situated between the at least first support and the retainer.

9. An electrical enclosure assembly comprising the protective apparatus of claim 1, and further comprising:
   an arc-resistant electrical enclosure;
   a forced air cooling system in fluid communication with the electrical enclosure and with the protective apparatus and being structured to cause a stream of air to flow from the electrical enclosure in a direction generally toward the protective apparatus.

10. The electrical enclosure assembly of claim 9 wherein the support apparatus further comprises at least a first bracket affixed to the forced air cooling system and a retainer affixed to the at least first bracket, the at least first body being situated between the at least first support and the retainer.

11. The electrical enclosure assembly of claim 10 wherein the plurality of flow channels are oriented in a generally vertical orientation and wherein the retainer is situated atop the flow apparatus.

12. A protective apparatus that is structured for use with a forced air cooling system of an electrical enclosure apparatus, the protective apparatus comprising:
   a duct having an interior region and structured to be connected in fluid communication with the forced air cooling system and being structured to carry a stream of air therethrough; and
   a flow apparatus comprising a plurality of flow channels formed therein, the flow apparatus being structured to be situated in the duct and to have the stream of air flow through the plurality of flow channels.

13. The protective apparatus of claim 12 wherein the protective apparatus is structured to resist the discharge of articles therethrough from an interior region of the electrical enclosure.

14. The protective apparatus of claim 12 wherein the duct comprises a support apparatus having at least a first support that is mounted to the at least first wall, the at least first body being situated adjacent the at least first support, and wherein the at least first support comprises a plate-like member that has formed therein at least a first opening through which the stream of air is structured to flow, the plurality of flow channels being situated in fluid communication with the at least first opening.

15. The protective apparatus of claim 14 wherein the at least first support further comprises a number of alignment structures that are engageable with the at least first body to retain the at least first body in a position overlying the at least first opening with the plurality of flow channels being situated in fluid communication with the at least first opening.

16. The protective apparatus of claim 15 wherein the plate-like member includes an upturned tab adjacent the at least first opening, the tab being an alignment structure of the number of alignment structures.

17. The protective apparatus of claim 16 wherein the support apparatus further comprises at least a first bracket affixed to the at least first wall and a retainer affixed to the at least first bracket, the at least first body being situated between the at least first support and the retainer.

18. The protective apparatus of claim 17 wherein the retainer comprises another plate-like member that has formed therein another opening through which the stream of air is structured to flow, the another plate-like member including another upturned tab that is situated adjacent the another opening and that is engageable with the at least first body to retain the at least first body in a position wherein the another opening and the at least first body overlie one another with the plurality of flow channels being situated in fluid communication with the another opening.

19. The protective apparatus of claim 12 wherein the duct comprises a support apparatus having at least a first support that is mounted to the at least first wall, the at least first body being situated adjacent the at least first support, and wherein the support apparatus further comprises at least a first bracket affixed to the at least first wall and a retainer affixed to the at least first bracket, the at least first body being situated between the at least first support and the retainer.

20. An electrical enclosure assembly comprising:

an electrical enclosure having an interior region;

a duct;

a forced air cooling system in fluid communication with the electrical enclosure assembly and the duct; the forced air cooling system configured to draw air out of the interior region of the electrical enclosure and exhaust it out of the duct; and a flow apparatus comprising a plurality of flow channels formed therein, the flow apparatus being structured to be situated in the duct and to have the air flow through the plurality of flow channels.

* * * * *